US006042348A

United States Patent [19]
Aakalu et al.

[11] Patent Number: 6,042,348

[45] Date of Patent: Mar. 28, 2000

[54] PROTECTIVE SHUTTER ASSEMBLY FOR A FORCED AIR COOLING SYSTEM

[75] Inventors: Nandakumar G. Aakalu, Suffern, N.Y.; Woodly Maurice, Irvington, N.J.

[73] Assignee: Lucent Technologies Inc., Murray Hill, N.J.

[21] Appl. No.: 09/075,479

[22] Filed: May 11, 1998

[51] Int. Cl.[7] .............................. F04B 17/00; H05K 7/20

[52] U.S. Cl. ....................... 417/423.5; 417/297; 417/427; 361/695

[58] Field of Search ................................ 417/286, 423.1, 417/297, 427, 423.5; 361/695

[56] References Cited

U.S. PATENT DOCUMENTS

| | | | |
|---|---|---|---|
| 1,532,635 | 4/1925 | Osbun | 361/695 |
| 4,495,545 | 1/1985 | Dufresne et al. | 361/695 |
| 4,594,940 | 6/1986 | Wolbrink et al. | 454/346 |
| 4,648,007 | 3/1987 | Garner | 361/695 |
| 5,412,534 | 5/1995 | Cutts et al. | 361/695 |
| 5,773,755 | 6/1998 | Iwatare | 174/17 VA |

*Primary Examiner*—Charles G. Freay
*Assistant Examiner*—Robert Z. Evora

[57] ABSTRACT

A protective shutter assembly for a fan of a forced air cooling system includes lightweight shutter members mounted for pivoting motion about vertical axes. When the fan is operative, its shutter members are pivoted in a first direction to expose the fan and allow air to be exhausted therefrom. When a fan is inoperative, its shutter members pivot in a second direction toward the fan and overlap to prevent air from being reversely drawn into the fan.

6 Claims, 2 Drawing Sheets

PROTECTIVE SHUTTER ASSEMBLY FOR A FORCED AIR COOLING SYSTEM

BACKGROUND OF THE INVENTION

This invention relates to a forced air cooling system and, more particularly, to a protective shutter assembly for the fans of such a system.

Electrical equipment which generates heat is often provided with at least two motor driven fans which draw air from a common enclosed space surrounding the electrical equipment and exhaust the drawn air to the ambient. Each of the fans is typically covered by a wire grid to protect a person's fingers from the fan blades. If one of the fans should fail, it acts as an air inlet for the functioning fan(s), thereby bypassing the normal cooling path and adversely impacting the cooling of the heat generating equipment. It would therefore be desirable to provide structure which prevents the aforedescribed cooling air bypass when a fan fails.

SUMMARY OF THE INVENTION

In accordance with the principles of this invention, there are provided protective shutter assemblies each associated with a respective fan in a forced air cooling system having at least two motor driven fans drawing air from a common enclosed space and exhausting the drawn air to the ambient. Each shutter assembly comprises a substantially planar solid member and mounting structure for the solid member between the respective fan and the ambient. The mounting structure includes a pivot holding the solid member, and being so arranged that the solid member (a) pivots in a first direction to expose the respective fan when the respective fan is operative to exhaust air and (b) pivots in a second direction to cover the respective fan when the respective fan is inoperative to prevent air from the ambient from being drawn past the respective fan into the common enclosed space.

In accordance with an aspect of this invention, the fans are arranged so that exhausted air is directed substantially horizontally and the mounting structure is arranged so that the solid member pivots about a vertical axis.

In accordance with another aspect of this invention, the assembly includes a plurality of substantially planar solid members and the mounting structure includes a plurality of parallel pivots each for holding a respective one of the plurality of solid members so that the solid members overlap when they pivot in the second direction to cover the respective fan.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
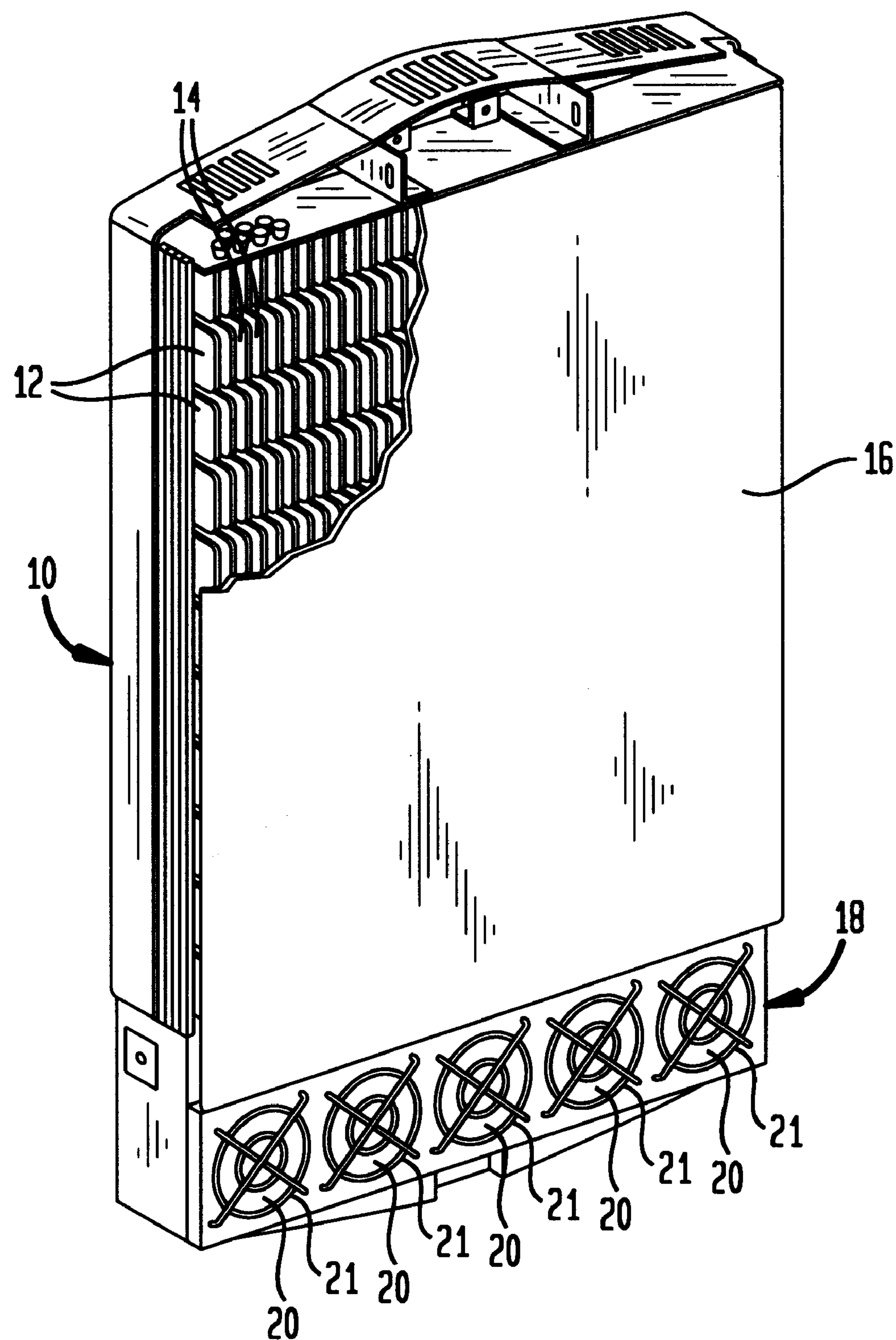
FIG. 1 is a perspective view, partially broken away, showing prior art electrical equipment having a forced air cooling system.

Referring now to the drawings, FIG. 1 shows illustrative prior art heat generating electrical equipment, designated generally by the reference numeral 10. The equipment 10 includes a plurality of heat conducting fins 12 arranged in parallel columns to form a plurality of vertical channels 14. The fins 12 are covered by a cover member 16 so that they are situated within an enclosed space. Below the cover member 16, and communicating with the enclosed space, is a fan assembly 18 to provide forced air cooling of the electrical equipment 10. Illustratively, the fan assembly 18 includes five fans 20, positioned side-by-side, and arranged to draw air from the enclosed space under the cover member 16 and to exhaust the drawn air to the ambient in a substantially horizontal direction. Thus, cooling air is drawn by the fans 20 downwardly through the channels 14 to cool the electrical equipment 10. Each of the fans 20 is covered by a wire grid 21 to protect a person's fingers from the blades of the fans 20.

Figure 2:
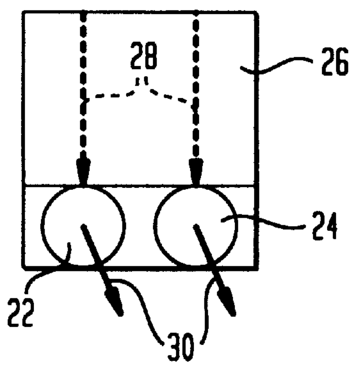
FIG. 2 schematically depicts air flow in a fully functioning prior art forced air cooling system of the type shown in FIG. 1.

FIG. 2 schematically illustrates the air flow pattern in equipment of the type shown in FIG. 1 wherein there are two functioning fans 22, 24, illustratively arranged side-by-side. The fans 22, 24 draw air from a common enclosed space under the cover member 26. Thus, as shown by the broken arrows 28, air is drawn downwardly behind the cover member 26 and through the vertical channels 14 between the fins 12 (FIG. 1) to the inlet ends of the fans 22, 24. As shown by the solid arrows 30, the drawn air is then exhausted from the outlet ends of the fans 22, 24 away from the enclosed space in a substantially horizontal direction.

Figure 3:
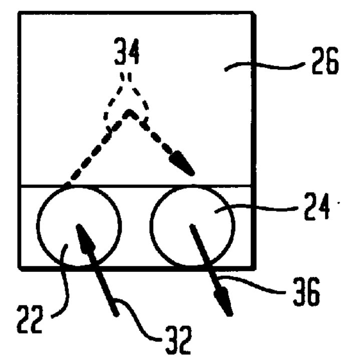
FIG. 3 schematically depicts air flow in the system of FIG. 2 when one of the fans is not operative.

FIG. 3 illustrates the air flow when the fan 22 is not operative. In this case, operation of the fan 24 draws air reversely through the fan 22 and into the common enclosed space behind the cover member 26, as shown by the arrow 32. This air passes behind the cover member 26 to the inlet end of the fan 24, as shown by the broken arrows 34 and is exhausted by the fan 24, as shown by the arrow 36. Since the fan 24 has a limited capacity, a large portion of its capacity is taken up by air which is drawn reversely through the fan 22, thus reducing the amount of air which can be drawn past the fins 12 (FIG. 1) and reducing the cooling capacity of the equipment.

Figure 4:
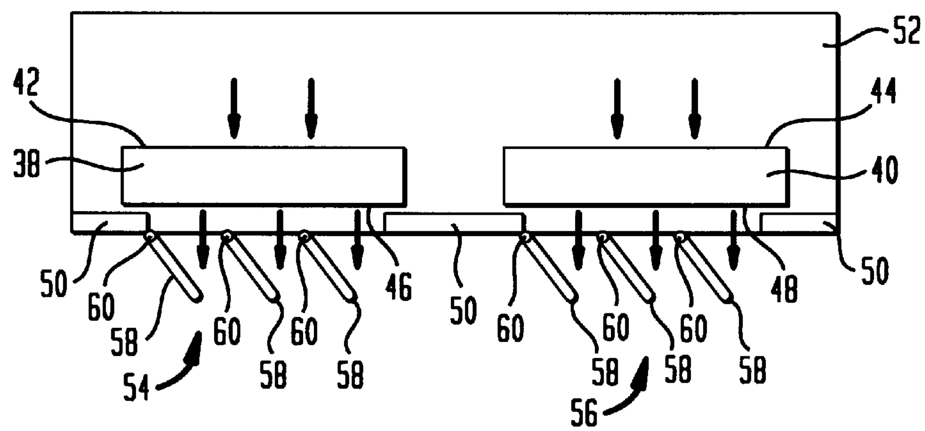
FIG. 4 is a schematic top plan view of a forced air cooling system including shutter assemblies according to the present invention, wherein both illustrated fans are properly functioning.
Figure 5:
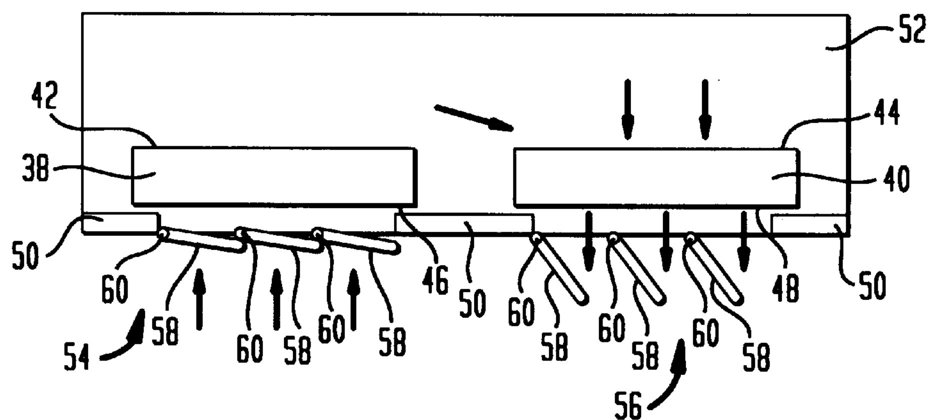
FIG. 5 is a view similar to FIG. 4 wherein one of the fans is not operative.

FIGS. 4 and 5 are schematic top plan views of a forced air cooling system incorporating structure according to the present invention. As shown, there are a pair of fans 38, 40, each having an air inlet end 42, 44, respectively, and an air outlet end 46, 48, respectively. The fans 38, 40 are supported on the brackets 50 so that when operative, they draw air into their air inlet ends 42, 44 from a common enclosed space 52 which is adjacent the heat generating equipment. The drawn air is exhausted from the air outlet ends 46, 48 away from the space 52 in a substantially horizontal direction. Associated with each of the fans 38, 40 is a respective shutter assembly, or protective shield, 54, 56. Each of the shutter assemblies 54, 56 is adjacent to and overlies the air outlet end 46, 48 of its respective fan 38, 40.

Construction and operation of only the shutter assembly 54 will given herein, it being understood that the shutter assembly 56 is identical thereto. Thus, the shutter assembly 54 includes a plurality, illustratively three, of solid members 58 which are substantially rectangular in shape and are mounted along one edge to a respective pivot 60. Preferably, the pivots 60 are parallel and vertically aligned. The spacing between the pivots 60 should be such that a person's finger cannot extend therebetween and is thus protected from contact with the fan blades.

The solid members 58 are of lightweight construction, illustratively being made from stamped aluminum. As shown in FIG. 4, when the fans 38, 40 are functioning, air drawn into their inlet ends 42, 44 and exhausted from their outlet ends 46, 48 causes the solid members 58 to pivot in a first direction away from the air outlet end and thus expose the fan. Usually, the fan pressure is low, so by using lightweight solid members 58 mounted on vertical pivots 60, gravitational effects are avoided.

As shown in FIG. 5, should the fan 38 become inoperative, the fan 40 will continue to draw air from the enclosed space 52 and will cause there to be a lower pressure at the air inlet end 42 of the fan 38 than in the ambient. Accordingly, this pressure differential will act on the solid members 58 of the shutter assembly 54 and cause the solid members 58 to pivot toward the air outlet end 46 of the fan 38. The solid members 58 are dimensioned so that they overlap when they are pivoted toward the air outlet end 46 of the fan 38. This almost entirely closes off the air outlet end 46 from the ambient to prevent air from being drawn reversely through the fan 38 and adversely effecting the cooling of the heat generating equipment. Thus, in effect, the shutter assembly 54 functions both as a protective shield for a person's fingers and as a one way valve for air flow.

Accordingly, there has been disclosed an improved protective shutter assembly for fans of a forced air cooling system. While an exemplary embodiment of the present invention has been disclosed herein, it is understood that various modifications and adaptations to the disclosed embodiment will be apparent to those of ordinary skill in the art and it is intended that this invention be limited only the scope of the appended claims. Thus, while the fans have been illustrated as being side-by-side, it is understood that this relative positioning is not a necessary part of the present invention, which requires that the fans draw air from a common enclosed space.

What is claimed is:

1. A forced air cooling system for heat generating equipment comprising:

at least two fans, each of said fans having an air inlet end and an air outlet end;

a structure for supporting said at least two fans so that said at least two fans when operative draw air into their air inlet ends from a common enclosed space adjacent said equipment and exhaust the drawn air from their air outlet ends away from said common enclosed space in a substantially horizontal direction; and, at least two protective shields each associated with a respective one of said at least two fans, each of said at least two shields being adjacent and overlying the air outlet end of its respective fan, each of said at least two shields including a pivotally mounted solid member arranged (a) to pivot away from the air outlet end when the respective fan is operative and air is exhausted outwardly from its air outlet end and (b) to pivot toward the air outlet end to cover the air outlet end when the respective fan is inoperative and air is drawn into its air outlet end, each of said at least two protective shields comprise a plurality of substantially planar solid members pivotally disposed across and intersecting with the outlet, in an equally spaced and overlapping louver arrangement, said solid members are arranged to pivot each about a respective one of a plurality of parallel axes.

2. The system according to claim 1 wherein each of said at least two protective shields is arranged to pivot about a respective vertical axis.

3. The system according to claim 1 wherein said plurality of parallel axes are vertical.

4. In combination with a forced air cooling system having at least two motor driven fans drawing air from a common enclosed space and exhausting the drawn air to an ambient outlet, at least two protective shutter assemblies each associated with a respective one of said fans, each of said shutter assemblies comprising:

a substantially planar solid member; and, a mounting structure for said solid member between the respective fan and the ambient, the mounting structure including a pivot holding the solid member, and being so arranged that the solid member (a) pivots in a first direction to expose the respective fan when the respective fan is operative to exhaust air and (b) pivots in a second direction to cover the respective fan when the respective fan is inoperative to prevent air from the ambient from being drawn past the respective fan into the common enclosed space;

each of said at least two protective shutter assemblies includes a plurality of substantially planar solid members and the mounting structure includes a plurality of parallel pivots each for holding a respective one of the plurality of solid members so that the solid members are all pivotally disposed across and intersect the outlet, in an equally spaced and overlapping louver arrangement.

5. The assembly according to claim 4 wherein the fans are arranged so that exhausted air is directed substantially horizontally and said mounting structure is arranged so that said solid member pivots about a vertical axis.

6. The assembly according to claim 5 wherein the spacing between adjacent ones of said parallel pivots is such that a person's finger is prevented from passing therebetween.

* * * * *